United States Patent [19]
Vincelette

[11] Patent Number: 5,272,395
[45] Date of Patent: Dec. 21, 1993

[54] CMOS STROBED COMPARATOR

[75] Inventor: Scott Vincelette, Billerica, Mass.

[73] Assignee: Analog Devices, Inc., Norwood, Mass.

[21] Appl. No.: 681,122

[22] Filed: Apr. 5, 1991

[51] Int. Cl.$^5$ .................. H03K 5/24; H03K 3/037; H03K 3/356
[52] U.S. Cl. .................. 307/355; 307/279; 307/530
[58] Field of Search .............. 307/350, 355, 530, 279

[56] References Cited

U.S. PATENT DOCUMENTS

| | | | |
|---|---|---|---|
| 4,247,791 | 1/1981 | Rovell | 307/530 |
| 5,032,744 | 7/1991 | Liu | 307/355 |
| 5,034,636 | 7/1991 | Reis et al. | 307/530 |
| 5,055,720 | 10/1991 | Tiede | 307/530 |
| 5,057,718 | 10/1991 | Proebsting | 307/530 |

OTHER PUBLICATIONS

Wu, Jieh-Tsorng and Wooley, Bruce A., "A 100-MHz Pipelined CMOS Comparator", IEEE Journal of Solid-State Circuits, vol. 23, No. 6, Dec. 1988, pp. 1379-1385.
Yukawa, Akira, "A CMOS 8-Bit High-Speed A/D Converter IC", IEEE Journal of Solid-State Circuits, vol. SC-20, No. 3, Jun. 1985, pp. 775-779.
Steyaert, M. and Comino, V., "High-Speed Accurate CMOS Comparator", Electronic Letters, 4th Aug. 1988, vol. 24, No. 16, pp. 1027-1028.

*Primary Examiner*—John Zazworsky
*Attorney, Agent, or Firm*—Wolf, Greenfield & Sacks

[57] ABSTRACT

An all CMOS voltage comparator circuit which incorporates a strobed latch. A strobe signal precharges the entire circuit to a known state which is independent of the input voltages and in which substantially no static current is drawn. Under static conditions after the circuit has been strobed, the source coupled pair is virtually disconnected from the supply voltage(s) and draws almost no current, as well. When the circuit is strobed, a source coupled FET pair amplifies the differential input signal, with positive feedback provided through a pair of cross coupled PMOS load transistors, as well as cross coupled NMOS cascode transistors. The source coupled pair feeds a pair of output buffers, or drivers, whose FETs are sized such that a "low" voltage level is generated on both outputs until the source-coupled pair resolves the input voltage difference (i.e., the differential input voltage exceeds the switching threshold). At that time, the outputs become complementary digital levels and are usable.

5 Claims, 1 Drawing Sheet

CMOS STROBED COMPARATOR

FIELD OF THE INVENTION

This invention relates to comparator circuits for comparison of two voltages, and, more particularly, to a CMOS voltage comparator. In greater particularity, the invention relates to a CMOS strobed comparator which draws virtually no current under static conditions.

BACKGROUND OF THE INVENTION

Voltage comparators are widely used in many electronic devices such as, but not limited to, switches for detecting when a level in a circuit exceeds some particular threshold and in response thereto initiating another action (e.g., turning on another circuit or a load, such as a light or heater, or setting an output level to indicate that a received signal was detected); signal generators for creating a variety of waveforms from triangles; class D amplifiers; pulse code modulators; switching power supplies; and analog to digital converters. Often, the performance of high speed data conversion systems and digital communications receivers is limited by the speed and precision of constituent comparator circuits.

A comparator is simply a circuit which tells which of two input voltages in larger. In general, it generates digital output levels and is required to sense (i.e., "resolve") small differences between the two input signal voltages. To meet these criteria, a large amplification factor is needed. Because of its high gain and stable characteristics, the differential amplifier stage has become the main building block of most comparators. Since linear amplification is not needed, the basic idea is to connect a differential amplifier so that it turns a transistor switch on or off, depending on the relative levels of the input signals. That is, the differential amplifier is operated non linearly, with one or the other of its two transistors cut off at any time.

Of course, this also means that one of the transistors is turned on and drawing current at any time. In some analog to digital converters (ADOC'S), such as flash converters, a large number of comparators may be employed. For example, in an n bit flash converter, the number of comparators may be $2^n - 1$ or greater. Thus for an 8-bit converter (which is not exceptionally high resolution), $2^7 = 128$ to $2^8 = 256$ comparators may be employed. Consequently, it is desirable to reduce the current drawn by each individual comparator not only during dynamic (i.e., switching) conditions, but also during static conditions when that particular state is being maintained.

As high gain circuits, comparators are particularly subject to the influence of noise on input signals. However, noise on the input signals, or either of them, can cause false triggering and erratic switching of the comparator output unless both of the input signals are much larger than the noise level. For that reason, many, indeed most, comparators employ hysteresis. The latter is a form of positive feedback which causes the differential threshold for switching to depend not only on the difference in input voltages, but also on the recent histories of the inputs. Unfortunately, the use of hysteresis is not without adverse effects. Principally, it slows the comparator response, introduces an integrator-like characteristic when enclosed in a feedback loop, and limits the lowest differential voltage which can be sensed.

Since the input signal voltages not only might change rapidly but also are likely to change at different rates (creating an unstable situation for generating a comparison), comparator outputs are often disabled until a safe time after the inputs change to a stable level. Thus, many comparators are provided with, or connected to, strobed latches to capture therein the comparator output at the particular point in time which is of interest, allowing the input signals to change once the latch has been strobed.

Many comparators also suffer from undue coupling between input and output. This causes the input switching threshold to vary with conditions (e.g., changing load impedance) at the output. The digital output of the comparator may, as a consequence, be erroneous.

Accordingly, it is an object of the present invention to provide an improved comparator which draws virtually no current under static conditions.

Another object of the invention is to provide a comparator employing both positive feedback and means for obviating, at least to a large extent, most of the negative effects of hysteresis.

Still another object of the invention is to provide a CMOS comparator which incorporates a strobed latch.

Yet another object of the invention is to provide a comparator with improved input/output decoupling.

SUMMARY OF THE INVENTION

The foregoing and other objects and advantages of the present invention are provided with an all CMOS voltage comparator circuit which incorporates a strobed latch. In one exemplary embodiment, the circuit provides a (normally complementary) pair of output signals. A strobe signal precharges the entire circuit to a known state in which substantially no static current is drawn. When the circuit is strobed, a source coupled FET pair amplifies the differential input signal with positive feedback provided through a pair of cross-coupled PMOS load transistors, as well as cross-coupled NMOS cascode transistors. The source-coupled pair feeds a pair of output buffers, or drivers, whose FETs are sized such that a "low" voltage level is generated on both outputs until the source-coupled pair resolves the input voltage (i.e., the differential input voltage exceeds the switching threshold). At that time, the outputs become complementary digital levels and are usable. Also, the source-coupled pair is disabled so that (a) no static current is drawn by those transistors, and (b) subsequent changes in the input will not cause the output to change until the circuit is strobed once more.

The invention will be more fully understood from the following detailed description, which should be read in conjunction with the accompanying drawing.

DETAILED DESCRIPTION

Figure 1:
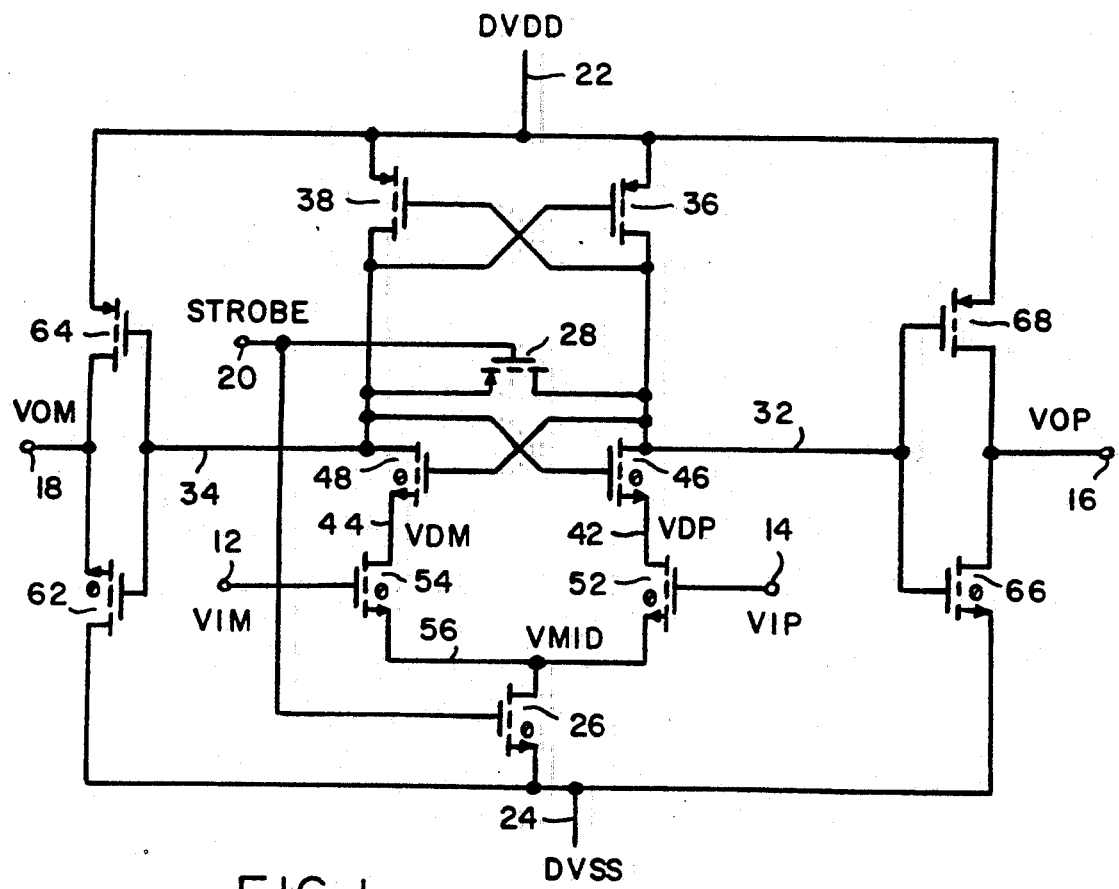
FIG. 1 shows a detailed schematic circuit diagram for an exemplary embodiment of a strobed comparator according to the present invention.

An all CMOS comparator according to the present invention is shown in illustrative form, in an exemplary embodiment, in FIG. 1. The comparator accepts input voltages VIM and VIP at input terminals 12 and 14, respectively. It provides differential output signals, VOP and VOM, at terminals 16 and 18, respectively.

The strobe signal STROBE is applied to terminal 20. The circuit is powered from a positive power supply voltage DVDD applied to rail 22 and a negative supply voltage DVSS applied rail 24.

When the STROBE signal is held low, at a voltage equal to DVSS, N channel field effect transistor (FET) 26 is turned off and P channel FET 28 is turned on. Nodes 32 and 34 are pulled up to the voltage (DVDD-$V_{tp}$) through P-channel FETS 36 and 38 where $V_{tp}$ a PMOS threshold voltage. FET 28 equalizes the voltage between nodes 32 and 34. Similarly, nodes 42 and 44 are pulled up to the voltage (DVDD-$V_{tp}$-$V_{tn}$) through transistors 46 and 48, respectively, where $V_{tn}$ is an NMOS threshold voltage. Through FETS 52 and 54, node 56 is pulled up to the lower of (1) an NMOS threshold below the highest of the two input voltages, VIP or VIM, or (2) the voltage (DVDD-$V_{tp}$-$V_{tn}$). Once nodes 56, 32 and 34 are charged as described, substantially no static current is drawn by the circuit.

When the STROBE signal applied to terminal 20 goes high to a voltage equal to DVDD, FET 26 is turned on and FET 28 is turned off. With FET 26 turned on, current is drawn through FETs 52 and 54. The difference between the currents in FETs 52 and 54 is proportional to the difference between the input voltages VIP and VIM. Between FETs 52 and 54, the device which has the higher input voltage at its gate will draw more current. This current differential will be converted to a voltage difference at nodes 32 and 34 by the load transistors 36 and 38. Positive feedback is applied to this voltage difference by cross coupling the loads, FETs 36 and 38, and by cross-coupling the cascode transistors, FETs 46 and 48. The positive feedback forces the node (32 or 34) on the side with the higher input voltage to be pulled down to a voltage near the DVSS lower supply voltage and causes the other node (34 or 32, as the case may be) on the side with the lower input voltage to be pulled up to the upper supply voltage DVDD. Once this state is reached, no static current is drawn. Additionally, changes in the input voltages are no longer reflected at the output terminals until the STROBE signal goes low and then goes high again, as the cross-coupled cascode transistors 46 and 48, by means of positive feedback, constitute a means for disabling the sensing means once the sensing means has resolved the difference between the first and second input voltages. Further, transistors 52 and 54, with load transistors 36 and 38, constitute a means for sensing the difference between the input voltages and for driving the first and second internal nodes 32 and 34 to voltages corresponding to the second input voltages.

FETs 26 and 28 thus constitute a means, responsive to the aforementioned sensing means, for disabling that sensing means when the STROBE signal applied to terminal 20 is in a first, low state and, as discussed in greater detail below, for enabling the sensing means when the strobe signal switches to a second, high state.

Transistors 62 and 64 together form an output inverter driven from node 34; likewise transistors 66 and 68 form an output inverter driven from node 32. These transistors are sized such that if the input terminals 12 and 14 are are tied together. The metastable state with the voltages at nodes 32 and 34 equal will cause the inverter outputs at terminals 16 and 18, to be less than 20% of DVDD. This will be interpreted as a low (i.e., logical zero) output. Such a situation ensures that both outputs stay low until the differential input voltage is high enough for the comparator to resolve the difference and decide which input is higher. That is, if both outputs are low, the comparator output should not be used as it is unreliable.

Figure 2:
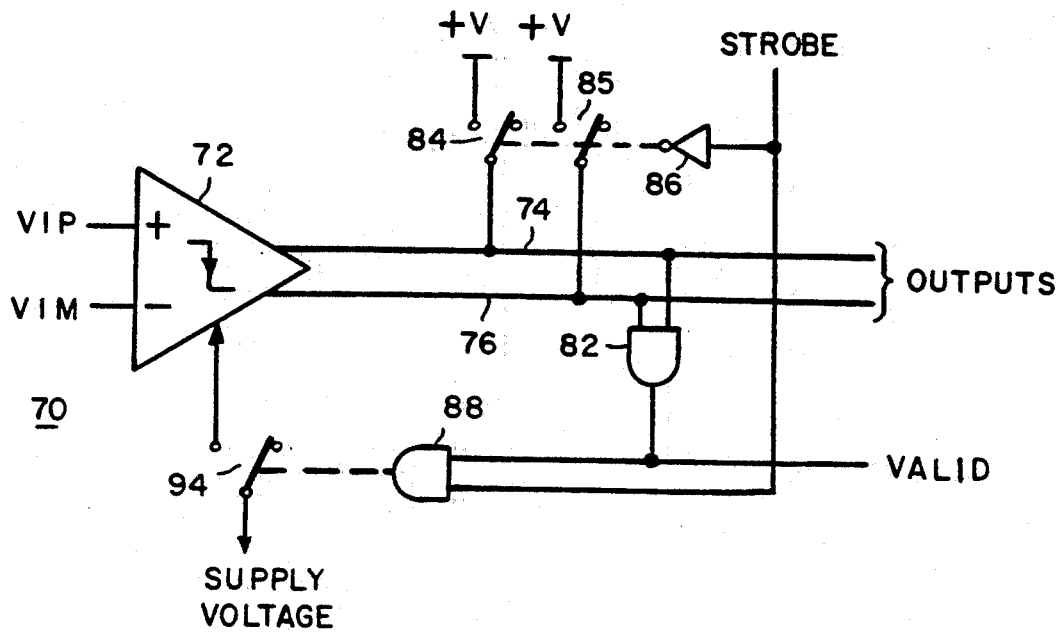
FIG. 2 shows a functional block diagram for a comparator according to the invention.

FIG. 2 represents an attempt to portray the invention more functionally. The "heart" of the comparator 70 is a high gain differential-pair gain stage 72 which receives differential input voltages VIP and VIM and generates complementary output signals and on lines 74 and 76, respectively. Line 74 is also connected to one input of an AND gate 82; and to one terminal of a switch 84. The other terminal of switch 84 connects to a supply voltage +V (equivalent, in FIG. 1, to DVDD). The second input of AND gate 82 receives the signal on line 76. The STROBE signal is supplied to the input of an inverter 86, which drives switches 84 and 85 and to one input of a second AND gate 88. The other input of AND gate 88 receives the output from AND gate 82, which also supplies a VALID signal indicating whether the input stage 72 has resolved the input signals. AND gate 88 controls the condition of a switch 94 which supplies power to gain stage 72.

When the STROBE signal is low, the output of AND gate 88 is low and switch 94 is open. This cuts off power from gain stage 72. Switch 84 is closed, bringing line 74 high and charging the output high.

When the STROBE signal goes high, the output of AND gate 88 goes high and closes switch 94, applying power to gain stage 72. The output of inverter 86 goes low, opening switches 84 and 85. Once the gain stage resolves a difference between input signals VIP and VIM, one of signals on lines 74 and 76 goes low. This causes the output of AND gate 82 to go low, in turn causing the output of AND gate 88 to go low, opening switch 94, cutting power to gain stage 72. It also generates the VALID signal. Consequently, AND gates 82 and 88 function as a means for (a) effectively disconnecting the gain stage 72 from the power supply during static conditions.

From the foregoing it will be seen that the circuit of FIGS. 1 and 2 has numerous advantages. It draws virtually no static current either in the latched state (i.e., when the STROBE signal level equals DVDD) or in the pre charged state (i.e., when the STROBE signal level equals DVSS). Hysteresis prevention is provided by precharging the differential mode nodes (i.e., nodes 32 and 34, 42 and 44 and lines 72, 74) to voltages which are independent of the input voltages, prior to each "decision" (i.e., valid comparison). The output inverter transistors can be sized to cause the outputs to stay in a predetermined logic state (as illustrated, a logical low, or zero, state) until the comparator can resolve the higher of the two inputs. Additionally, cascode connected transistors 46 and 48 provide both decoupling from input to output as well enhanced positive feedback.

Having thus described the basic concept of the invention, it will be readily apparent to those skilled in the art that the foregoing detailed disclosure is intended to be presented by way of example only, and is not limiting. For example, though the circuit is shown as being powered from both positive and negative voltage supplies, the invention agent might in another embodiment be powered from only a single supply voltage. Various other alterations, improvements, and modifications will occur and are intended to those skilled in the art, though not expressly stated herein. These modifications, alterations, and improvements are intended to be suggested hereby, and are within the spirit and scope of the invention. Accordingly, the invention is limited only by the following claims and equivalents thereto:

What is claimed is:

1. A strobed comparator for generating an output voltage indicative of the state of the voltage difference between first and second input voltages which may be applied thereto at respective first and second input terminals, upon a strobing signal going from a first state to a second state, comprising:
   a. a first output driver connected between a first internal node and a first output node;
   b. a second output driver connected between a second internal node and a second output node;
   c. means for sensing the difference between the input voltages and for driving the first and second internal nodes to corresponding first and second voltages;
   d. first means responsive to the means for sensing, for disabling the means for sensing when the strobe signal is applied in a first state and enabling the means for sensing when the strobe signal switches to a second state;
   e. second means for disabling the means for sensing once the means for sensing has resolved the difference between the first and second input voltages; and
   f. means responsive to the strobe signal for precharging the first and second internal nodes to a voltage independent of the first and second input voltages when the strobe signal is applied in said first state.

2. The comparator of claim 1 wherein the first means for disabling essentially prevents the means for sensing from drawing supply current when the strobe signal is applied in said first state.

3. The comparator of claim 1 wherein the output drivers are inverters.

4. The comparator of claim 3 wherein each of said output drivers is formed of a complementary pair of field effect transistors (FETs) having their respective source electrodes adapted to be connected, respectively, to receive first and second supply voltages and the FETs being sized to provide output voltages which are both logical zero values when the voltage difference between the first and second input voltages is too small for the means for sensing to resolve and the first and second internal modes accordingly are driven to substantially the same voltage.

5. A strobed comparator for generating an output voltage indicative of the state of the voltage difference between first and second input voltages which may be applied thereto at respective first and second input terminals, upon a strobing signal going from a first state to a second state, comprising:
   a. a first output driver connected between a first internal node and a first output node;
   b. a second output driver connected between a second internal node and a second output node;
   c. means responsive to the strobe signal for precharging the first and second internal nodes to a voltage independent of the first and second input voltages when the strobe signal is applied in a first state;
   d. means for sensing the difference between the input voltages and for driving the first and second internal nodes to corresponding first and second voltages;
   e. first means responsive to the means for sensing, for disabling the means for sensing when the strobe signal is applied in said first state, so that no static current is drawn by the means for sensing, and enabling the means for sensing when the strobe signal switches to a second state; and
   f. second means for disabling the means for sensing so that no static current is drawn by the means for sensing, but preserving the voltages at the first and second internal nodes, once the means for sensing has resolved the difference between the first and second input voltages.

* * * * *